(12) United States Patent
Hiratsuka

(10) Patent No.: US 7,772,023 B2
(45) Date of Patent: Aug. 10, 2010

(54) METHOD OF PRODUCING SEMICONDUCTOR OPTICAL DEVICE

(75) Inventor: Kenji Hiratsuka, Yokohama (JP)

(73) Assignee: Sumitomo Electric Industries Ltd., Osaka (JP)

(*) Notice: Subject to any disclaimer, the term of this patent is extended or adjusted under 35 U.S.C. 154(b) by 0 days.

(21) Appl. No.: 12/292,538

(22) Filed: Nov. 20, 2008

(65) Prior Publication Data
US 2009/0142869 A1    Jun. 4, 2009

(30) Foreign Application Priority Data
Nov. 30, 2007    (JP)    ............... 2007-311412

(51) Int. Cl.
*H01L 21/00*    (2006.01)
(52) U.S. Cl. .................. 438/39; 438/41; 257/E21.463; 257/E21.326
(58) Field of Classification Search .............. 438/41, 438/39; 257/E21.463, E21.34, E21.322, 257/E21.326, E21.461
See application file for complete search history.

(56) References Cited

U.S. PATENT DOCUMENTS 5,821,155 A * 10/1998 Izumi et al. ................. 438/479
6,556,605 B1 * 4/2003 Shtengel et al. ........... 372/46.01
2003/0205716 A1 * 11/2003 Massa et al. ................... 257/94

FOREIGN PATENT DOCUMENTS

| JP | 9-214045 | 8/1997 |
|----|----------|--------|
| JP | 2003-60310 | 2/2003 |

* cited by examiner

*Primary Examiner*—Caridad M Everhart
(74) *Attorney, Agent, or Firm*—Smith, Gambrell & Russell, LLP

(57) ABSTRACT

Si atoms obtained by thermal decomposition of $SiH_4$ are adsorbed in advance on one surface of a semiconductor substrate and side surfaces of a semiconductor mesa part. Thereby, prior to the growth of a buried layer, a diffusion protection layer composed of Si-doped InP with high impurity concentration is formed. As a result, when the buried layer is grown, Zn diffusing from an upper cladding layer is trapped by the diffusion protection layer, and interdiffusion between Zn and Fe is inhibited. Since the diffusion protection layer is formed uniformly at a small thickness of several monolayers, the diffusion protection layer is also inhibited from becoming a current leakage path. Consequently, the reliability of the semiconductor optical device can be improved.

7 Claims, 7 Drawing Sheets

METHOD OF PRODUCING SEMICONDUCTOR OPTICAL DEVICE

BACKGROUND OF THE INVENTION

1. Field of the Invention

The present invention relates to a method of producing a semiconductor optical device.

2. Description of the Related Art

A semiconductor optical device with a buried heterostructure is known, the semiconductor optical device having a buried layer formed on both side faces of a semiconductor mesa part. Such a semiconductor optical device has a semiconductor mesa part including an n-type cladding layer, an active layer, a p-type cladding layer, and a p-type contact layer disposed in that order on one surface of a semiconductor substrate. For example, a semi-insulating layer of InP doped with iron (Fe) is disposed as a buried layer on both side faces of the semiconductor mesa part.

When a p-type cladding layer of the semiconductor mesa part is doped with zinc (Zn), as a p-type impurity, interdiffusion between Zn and Fe occurs at the interface between the p-type cladding layer and the buried layer. The interdiffusion between Zn and Fe may decrease the p-type carrier concentration in the vicinity of the interface and degrade the current blocking properties of the buried layer due to decrease of its resistivity. Then, this interdiffusion between Zn and Fe results in increasing the amount of leakage current flowing into the buried layer and decreasing the reliability of the semiconductor optical device.

Under these circumstances, for example, in a semiconductor optical device according to Japanese Unexamined Patent Application Publication No. 9-214045, a diffusion protection layer of an n-type InP is disposed between a mesa stripe including an active layer and a buried layer of an Fe-doped InP. Furthermore, a semiconductor optical device according to Japanese Unexamined Patent Application Publication No. 2003-60310 includes a diffusion protection layer of an InP doped with ruthenium (Ru). The n-type impurity or Ru added as a dopant to the diffusion protection layer prevents interdiffusion between Zn and Fe.

SUMMARY OF THE INVENTION

It is an object of the present invention to provide a method of producing a semiconductor optical device in which diffusion of an impurity into a buried layer is inhibited and formation of a current leakage path at a buried region is inhibited, and thereby, the reliability of the semiconductor optical device can be improved.

In order to solve the above problem, a method of producing a semiconductor optical device according to the present invention includes step (a) of growing, on one surface of a semiconductor substrate, a group III-V compound semiconductor layer which includes a cladding layer of a first conductivity type, an active layer, and a Zn-doped cladding layer of a second conductivity type; step (b) of forming a semiconductor mesa part on the semiconductor substrate by etching the group III-V compound semiconductor layer using a predetermined mask; step (c) of supplying a source material containing Si and a group V source material containing phosphorus, thermally decomposing the source material containing Si to obtain Si atoms, and allowing the Si atoms to be adsorbed on the one surface of the semiconductor substrate and side surfaces of the semiconductor mesa part; step (d) of supplying a group III source material containing an indium and the group V source material containing phosphorus, and forming a Si-doped InP layer on the one surface of the semiconductor substrate and the side surfaces of the semiconductor mesa part with the Si atoms being incorporated thereinto; and step (e) of continuously supplying the group III source material containing an indium and growing an Fe-doped in P layer which buries the semiconductor mesa part on the one surface of the semiconductor substrate.

In the method of producing the semiconductor optical device, before supplying a group III source material containing an indium, a group V source material containing phosphorus and a source material containing Si are supplied. Then, Si atoms generated by the decomposition of the source material containing Si are allowed to be adsorbed on one surface of the semiconductor substrate and side surfaces of the semiconductor mesa part in advance. Therefore, when the group III source material containing an indium is supplied thereafter, an InP layer grows while incorporating the Si atoms thereinto, and a Si-doped InP layer having a high impurity concentration, e.g., $1 \times 10^{19}$ cm$^{-3}$ or more, is formed on the one surface of the semiconductor substrate and the side surfaces of the semiconductor mesa part. As a result, in the vicinity of the interface between the Si-doped InP layer and the second conductivity type cladding layer doped with Zn as a dopant, Zn is diffused into the Si-doped InP layer, and before the element Zn enters the Fe-doped InP layer, Si—Zn pairs are formed. Consequently, interdiffusion between Zn and Fe is inhibited between the second conductivity type cladding layer doped Zn and the Fe-doped InP layer. In contrast, in a conventional method of growing a Si-doped InP layer, a Si-doped InP layer is usually grown while supplying a group III source material containing an indium (In) and a group V source material containing a phosphorus (P), or the like and a dopant source material containing a silicon (Si) together during crystal growth. In such a conventional growth method, the upper limit of the concentration of the Si impurity to be added as a dopant to the InP layer is about $3 \times 10^{18}$ cm$^{-3}$. In this case, the thickness of the Si-doped InP layer needs to be thick to inhibit the interdiffusion between Zn and Fe effectively. When the thickness of the Si-doped InP layer increases, the leakage current through this Si-doped InP layer increases. In the method of producing a semiconductor optical device according to the present invention, it is possible to form a high-concentration Si-doped InP layer uniformly at a small thickness of several monolayers on the one surface of the semiconductor substrate and the side surfaces of the semiconductor mesa part. Consequently, it is also possible to inhibit the Si-doped InP layer from becoming a current leakage path because of its small thickness of several monolayers.

In the method of the invention, the source material containing Si is a silane-based gas. Furthermore, preferably, the silane-based gas is thermally decomposed at a temperature in the range of 600° C. to 700° C. If the temperature is too low, the silane-based gas is not easily decomposed at the surface of the semiconductor layer, resulting in insufficient adsorption of Si atoms. If the temperature is too high, the Si atoms adsorbed on the surface of the semiconductor layer may be desorbed from the surface of the semiconductor layer. Consequently, by performing thermal decomposition of the silane-based gas in the temperature range described above, the Si atoms can be suitably adsorbed on the one surface of the semiconductor substrate and the side surfaces of the semiconductor mesa part.

Furthermore, preferably, after a non-doped InP layer is grown at a predetermined thickness on the surface of the Si-doped InP layer, the Fe-doped InP layer is grown while supplying a source material containing an iron (Fe). By performing doping of Fe into the InP layer after Si—Zn pairs are formed sufficiently in the vicinity of the interface between the Si-doped InP layer and the second conductivity type cladding layer doped Zn, interdiffusion between Zn and Fe can be more reliably inhibited.

Furthermore, in the method of producing a semiconductor optical device according to the present invention, preferably, the Si-doped InP layer has a thickness in the range of 10 to 80 nm. In order for the Si-doped InP layer to effectively inhibit the interdiffusion between Zn and Fe at the interface between the second conductivity type cladding layer and the Fe-doped InP layer, it is required to set the thickness of the Si-doped InP layer formed on the one surface of the semiconductor substrate and the side surfaces of the semiconductor mesa part at 10 nm or more. On the other hand, if the thickness of the Si-doped InP layer is large, the Si-doped InP layer may become a current leakage path because an n-type semiconductor such as the Si-doped InP has a lower resistivity than that of p-type semiconductor. Consequently, by setting the thickness of the Si-doped InP layer in the range described above, it is possible to prevent the Si-doped InP layer from becoming a current leakage path and to prevent the leakage current from increasing.

Furthermore, preferably, the Si-doped InP layer has a Si concentration of $4 \times 10^{18}$ cm$^{-3}$ or more. Thereby, Zn diffusing into the Si-doped InP layer is effectively trapped in the vicinity of the interface between the Si-doped InP layer and the second conductivity type cladding layer, and interdiffusion between Zn and Fe is inhibited, even if the thickness of the Si-doped InP layer is several monolayers.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

The preferred embodiments of the present invention will be described in detail with reference to the drawings. In the drawings, the same components are designated by the same reference numerals, and duplicate descriptions are omitted. Furthermore, the scales in the drawings are not necessarily equal to those in the description.

It is known that the conventional semiconductor optical devices with a buried heterostructure have the problems described below. In the conventional semiconductor optical device with a buried heterostructure, a semi-insulating layer of InP doped with iron (Fe) is disposed as a buried layer on both side faces of the semiconductor mesa part. And a p-type InP cladding layer of the semiconductor mesa part is doped with zinc (Zn). In any of the conventional semiconductor optical devices with a buried heterostructure, a diffusion protection layer is formed using an organometallic vapor phase epitaxy (OMVPE) method. When such a crystal growth method is used, there is a limit on the high-concentration doping of an impurity into InP. Therefore, it is not possible to obtain a high impurity concentration required for preventing the interdiffusion between Zn and Fe. Consequently, in order to sufficiently prevent the interdiffusion between Zn and Fe, the thickness of the diffusion protection layer must be set at a certain value or larger. However, if the diffusion protection layer becomes thick, the electrical resistance of the diffusion protection layer decreases, and as a result, a current leakage path is formed. In particular, an n-type InP material has a lower resistivity than that of p-type InP material. When n-type InP material is used as the diffusion protection layer, the amount of leakage current flowing through the diffusion protection layer increases. This results in an increase in the threshold current and a decrease in the light emission efficiency of the semiconductor optical device.

Furthermore, the growth rate depends on the surface orientation of semiconductor crystal on which a semiconductor layer such as InP is grown by using OMVPE method, for example. Meanwhile, the plane orientation of the one surface of the semiconductor substrate is, for example, a (001) plane, and the side surfaces of the semiconductor mesa part are composed of a plurality of planes, such as a (11$n$) plane (where n is an integer).

The diffusion protection layer is grown on the one surface of the semiconductor substrate and the side surfaces of the semiconductor mesa part. Consequently, it is difficult to control that the diffusion protection layer has a uniform thickness because of having the different growth rates in growing on the surface of the semiconductor substrate and the side surfaces of the semiconductor mesa part. For the reasons described above, in the conventional semiconductor optical devices, it is difficult to both prevent the formation of a current leakage path and to inhibit the diffusion of Zn into the buried layer of an Fe-doped InP.

Figure 1:
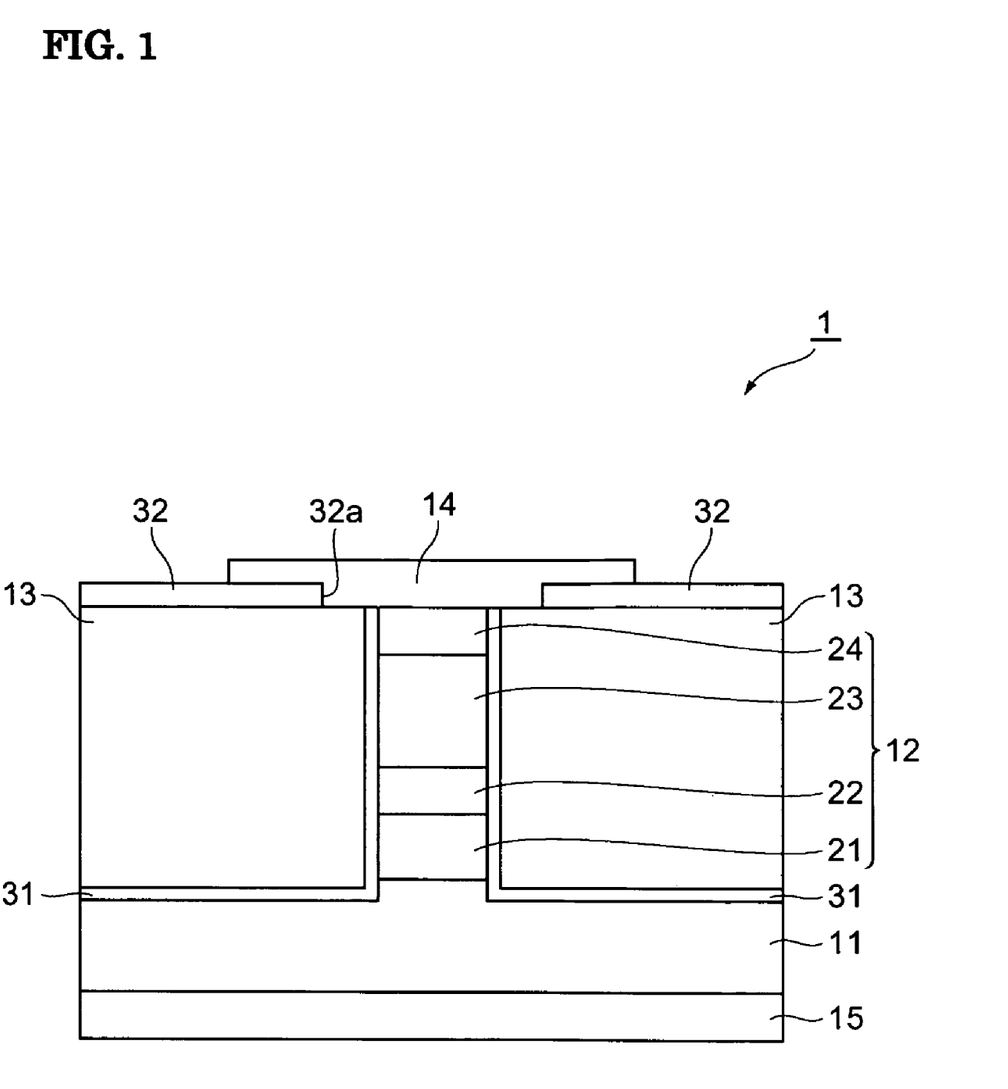
FIG. 1 is a cross-sectional view showing a structure of a semiconductor laser device produced using a method of producing a semiconductor optical device according to an embodiment of the present invention.

FIG. 1 is a cross-sectional view showing a structure of a semiconductor laser device produced using a method of producing a semiconductor optical device according to an embodiment of the present invention. As shown in FIG. 1, a semiconductor laser device includes a semiconductor substrate 11, a semiconductor mesa part 12, a buried layer 13, an electrode 14, and another electrode 15.

The semiconductor substrate 11 is, for example, an n-type InP substrate doped with Si. The semiconductor substrate 11 has an impurity concentration of, for example, $1\times10^{18}$ cm$^{-3}$. Furthermore, the thickness of the semiconductor substrate 11 is, for example, 100 μm.

The semiconductor mesa part 12 protrudes in a stripe shape from one surface of the semiconductor substrate 11. The semiconductor mesa part 12 includes a lower cladding layer 21, an active layer 22, an upper cladding layer 23, and a contact layer 24 disposed in that order on the semiconductor substrate 11.

The lower cladding layer 21 is, for example, an n-type InP layer doped with Si as an n-type dopant. The lower cladding layer 21 has an impurity concentration of, for example, $1\times10^{18}$ cm$^{-3}$. Furthermore, the thickness of the lower cladding layer 21 is, for example, 600 nm.

The active layer 22 is, for example, a multi-quantum well (MQW) structure including an un-doped GaInAsP as well layers and another un-doped GaInAsP with a composition different from that of the well layers as barrier layers. The active layer 22, for example, has a band gap wavelength of 1.55 μm. A semiconductor optical waveguide layer (not shown) is disposed on the upper and lower sides of the multi-quantum well, thus forming a separate confinement hetero-structure (SCH). The refractive index of the semiconductor optical waveguide layer is lower than the refractive index of each of the wells and the barriers in the multi-quantum well, and it is possible to efficiently confine the light generated in the active layer 22.

The upper cladding layer 23 is, for example, a p-type InP layer doped with Zn as a p-type dopant. The upper cladding layer 23 has an impurity concentration of, for example, $1\times10^{18}$ cm$^{-3}$. Furthermore, the thickness of the upper cladding layer 23 is, for example, 1,600 nm. The light generated in the active layer 22 is effectively confined within the active layer by forming a waveguide structure with the active layer and the upper and lower cladding layers.

The contact layer 24 is, for example, a p+-type InGaAs layer doped with Zn. The contact layer 24 has an impurity concentration of, for example, $1.5\times10^{19}$ cm$^{-3}$. Furthermore, the thickness of the contact layer 24 is, for example, 300 nm.

The buried layer 13 is, for example, a semi-insulating layer of InP doped with Fe. The buried layer 13 has an impurity concentration of, for example, $1.0\times10^{17}$ cm$^{-3}$ to obtain a high resistivity as a current blocking layer. The buried layer 13 is disposed on the one surface of the semiconductor substrate 11 so as to cover both sides of the semiconductor mesa part 12. Thereby, the semiconductor mesa part 12 is buried. The upper surface of the buried layer 13 is substantially flush with the upper surface of the semiconductor mesa part 12, and thus, the semiconductor laser device 1 is planarized.

Furthermore, a diffusion protection layer 31 is disposed at the interface between the buried layer 13 and the semiconductor substrate 11 and at the interface between the buried layer 13 and the both side of the semiconductor mesa part 12. The diffusion protection layer 31 is, for example, a Si-doped InP layer. The diffusion protection layer 31 has an impurity concentration of, for example, $4\times10^{18}$ cm$^{-3}$ or more. Furthermore, the thickness of the diffusion protection layer 31 is, for example, several monolayers.

The diffusion protection layer 31 prevents interdiffusion between Zn and Fe by trapping Zn at the interface between the upper cladding layer 23 and the buried layer 13. Thereby, in the semiconductor laser device 1, it is possible to inhibit a decrease of the p-type carrier concentration in the upper cladding layer 23 and a decrease of the resistivity of the buried layer 13. Consequently, the reliability of the semiconductor laser device 1 is improved in the vicinity of the interface between the upper cladding layer 23 and the buried layer 13.

An insulating film 32, for example, composed of silicon oxide (SiO$_2$) or silicon nitride (SiN) is provided on the surface of the buried layer 13. The insulating film 32 has a thickness of, for example, about 0.4 μM. A stripe-shaped opening 32a is formed in the center of the insulating film 32 so as to expose the upper surface of the semiconductor mesa part 12. The insulating film 32 restricts the region of the semiconductor mesa part 12 through which the current to be injected into the active layer 22 of the semiconductor mesa part 12 passes when the semiconductor laser device 1 is driven.

An electrode 14 is formed on the insulating film 32 so as to cover the opening 32a of the insulating film 32. The electrode 32 directly contacts with the contact layer 24 at the opening 32a. Another electrode 15 is formed on the other surface of the semiconductor substrate 11.

A method of producing a semiconductor laser device 1 having the structure described above will now be described.

Figure 2:
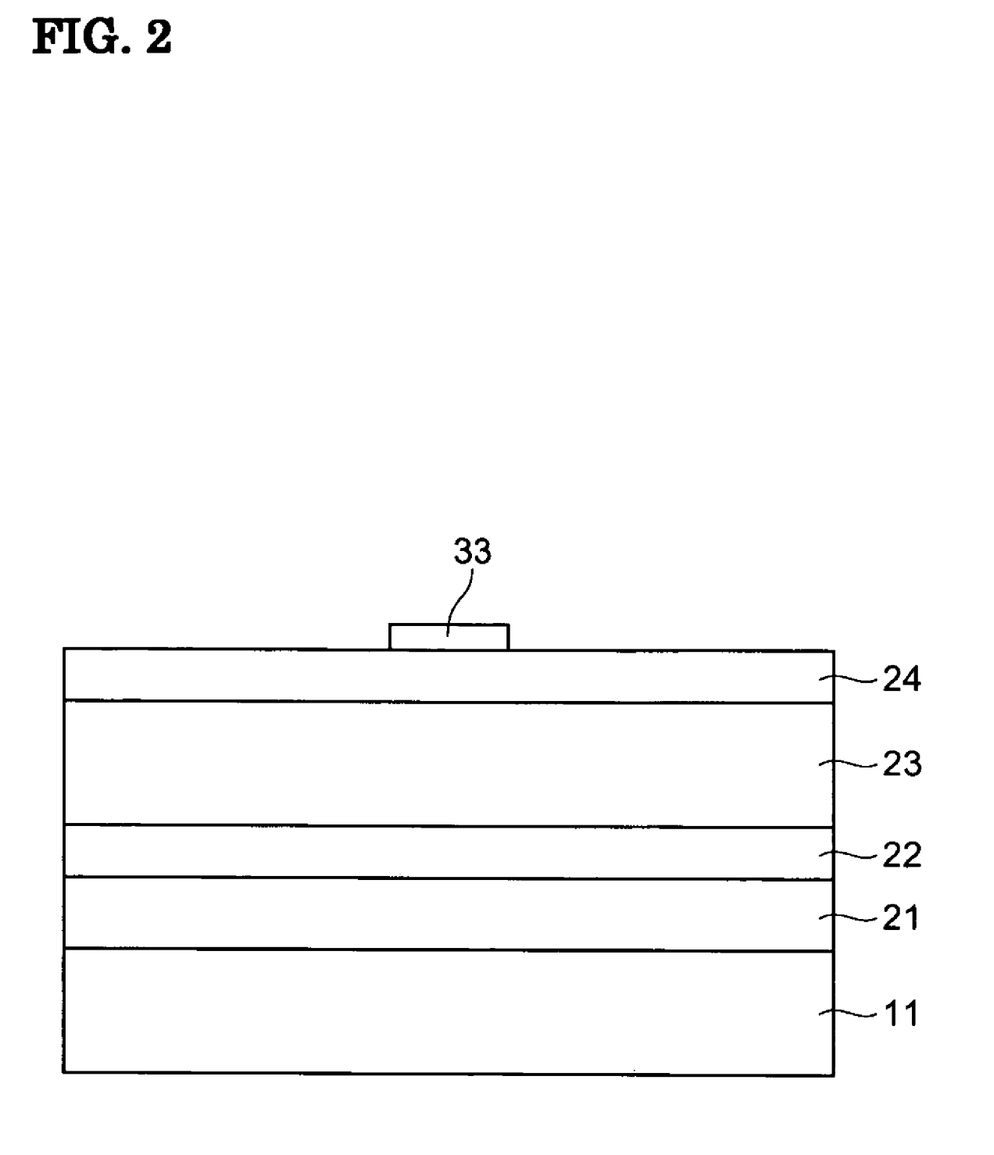
FIG. 2 is a schematic diagram showing a state in which a semiconductor multilayered film including an active layer is disposed on an InP semiconductor substrate, and a stripe-shaped insulating film is formed as an uppermost layer in a method of producing the semiconductor laser device shown in FIG. 1.

First, a semiconductor substrate 11 composed of Si-doped n-type InP is prepared. Next, as shown in FIG. 2, a lower cladding layer 21 composed of Si-doped n-type InP, an active layer 22 composed of InGaAsP, an upper cladding layer 23 composed of Zn-doped p-type InP, and a contact layer 24 composed of Zn-doped p$^{+-}$ type InGaAs are grown in that order on one surface of a semiconductor substrate 11, for example, by an OMVPE crystal growth method.

Figure 3:
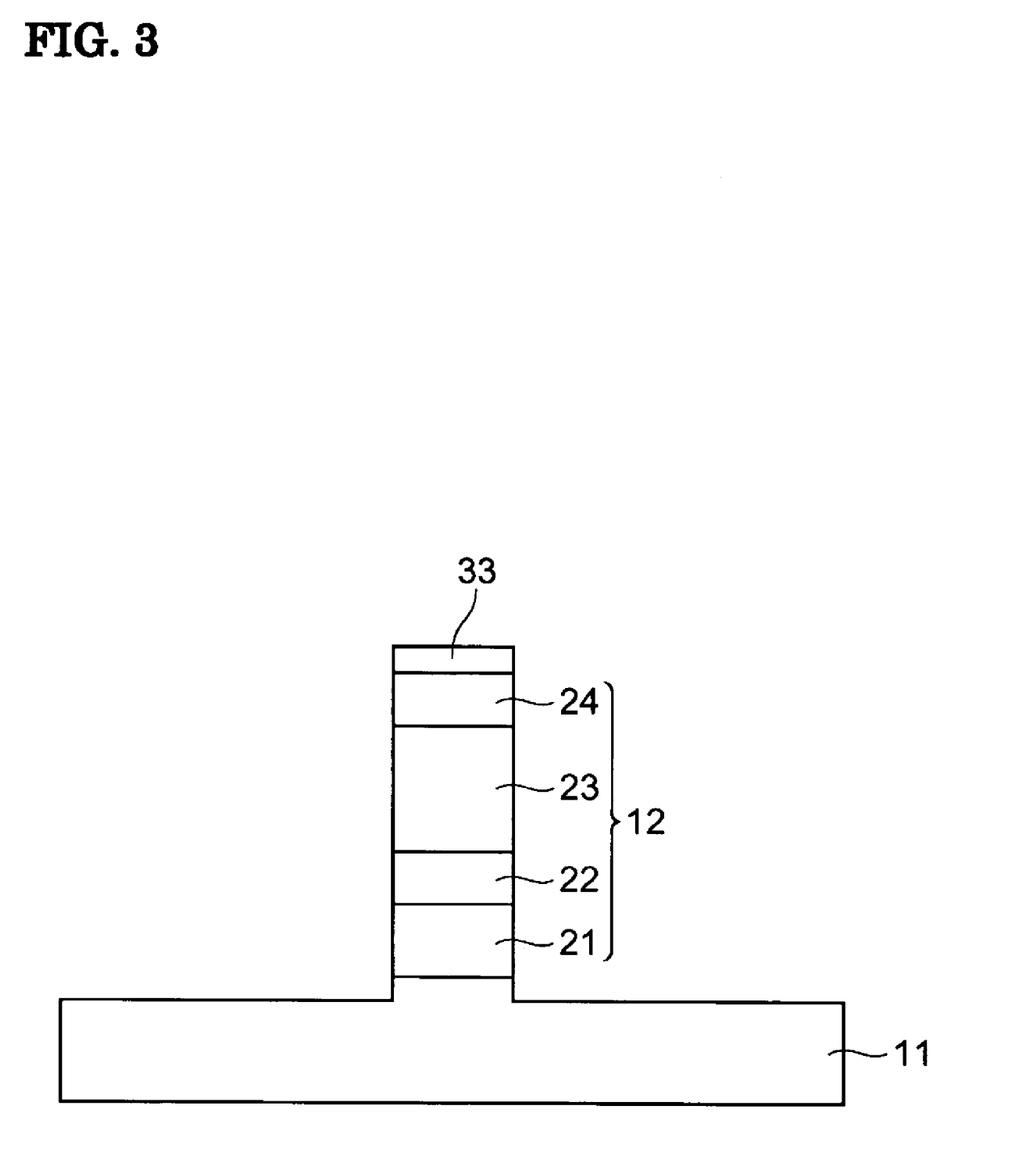
FIG. 3 is a schematic diagram showing a step of forming a semiconductor mesa part, subsequent to the step shown in FIG. 2.

Next, an insulating film 33, for example, composed of SiO$_2$ or SiN is formed on the surface of the contact layer 24. The insulating film 33 is formed into a stripe shape with a width of about 1.8 μm by photolithography. Then, using the stripe-shaped insulating film 33 as a mask, dry etching is performed using a gas, for example, SiCl$_4$. As a result, as shown in FIG. 3, a stripe-shaped semiconductor mesa part 12 is formed on the one surface of the semiconductor substrate 11. After the semiconductor mesa part 12 is formed, an altered layer (damaged layer) formed in the dry etching process is removed by predetermined wet etching.

Figure 4:
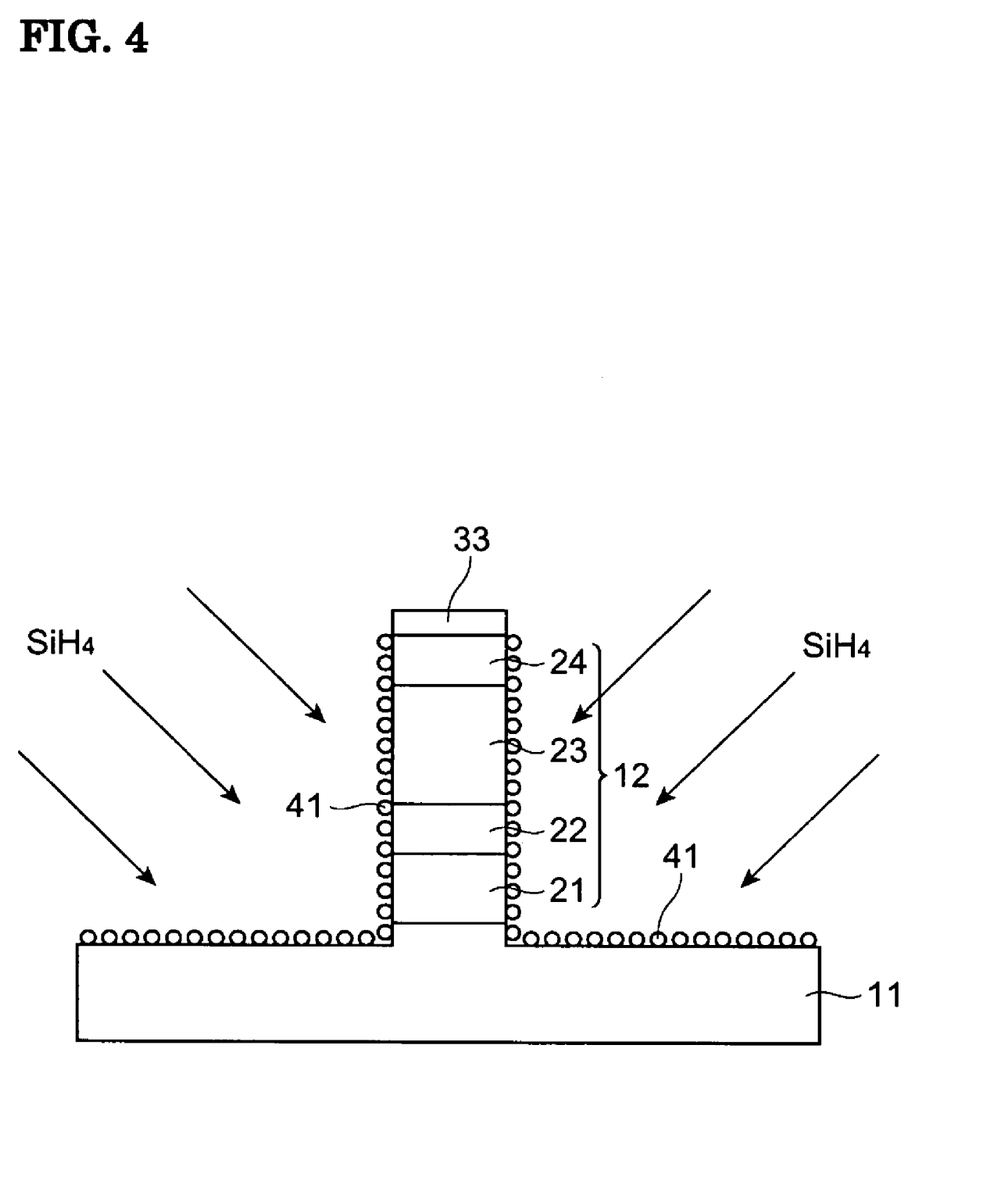
FIG. 4 is a schematic diagram showing a step of allowing Si atoms to be adsorbed on one surface of the semiconductor substrate and side surfaces of the semiconductor mesa part, subsequent to the step shown in FIG. 3.

Next, the semiconductor substrate 11 is introduced into an OMVPE furnace. Phosphine (PH$_3$) and H$_2$ gas are supplied into the OMVPE furnace, and the temperature is increased to about 650° C. The flow rate of PH$_3$ and H$_2$ gas are 400 sccm and 2,000 sccm, respectively. Then, as shown in FIG. 4, silane (SiH$_4$) is supplied to the semiconductor substrate 11 for about 5 minutes. The flow rate of SiH$_4$ is 20 sccm. The supplied SiH$_4$ is thermally decomposed, and Si atoms 41 are adsorbed to the one surface of the semiconductor substrate 11 and the both side surfaces of the semiconductor mesa part 12. During the supply of SiH$_4$, an adsorption-desorption equilibrium of the Si atoms 41 is maintained in the vicinity of the surface to which Si atoms is adsorbed. And a layer of Si with a thickness of several monolayers is formed on the one surface of the semiconductor substrate 11 and the both side surfaces of the semiconductor mesa part 12.

According to this embodiment, PH$_3$ is supplied as a source gas of phosphorus (P), and SiH$_4$ is used to supply Si atoms. A metalorganic raw material gas such as tertiarybutylphosphine (TBP) is also used for a group V source material containing phosphorus. TBP is thermally decomposed at lower temperature than PH$_3$. When TBP is used as a source material of P, an InP layer is grown at lower temperature of around 600° C. Disilane (Si$_2$H$_6$) and a metalorganic raw material gas such as tetramethylsilane ((CH$_3$)$_4$Si) tetraethylsilane, ((C$_2$H$_5$)$_4$Si) are also used to supply Si atoms.

Figure 5:
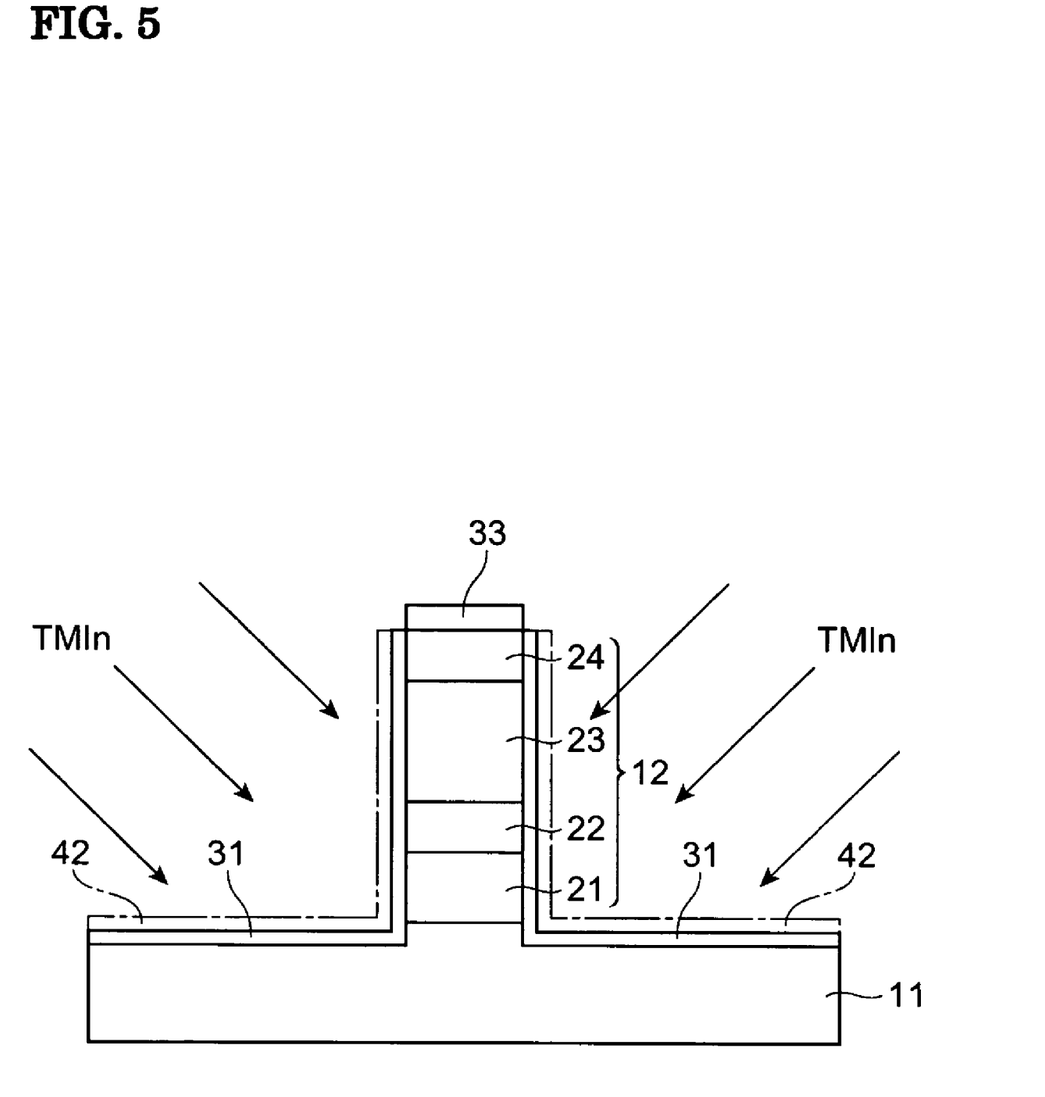
FIG. 5 is a schematic diagram showing a step of forming a diffusion protection layer, subsequent to the step shown in FIG. 4.

After stopping the supply of SiH$_4$, as shown in FIG. 5, tri-methyl indium (TMIn) is supplied into the OMVPE furnace. The flow rate of TMIn is 300 sccm. The temperature inside the furnace is continued to be maintained at about 650° C. An InP layer is grown while incorporating thereinto the Si atoms adsorbed to the one surface of the semiconductor substrate 11 and the both side surfaces of the semiconductor mesa part 12. Thereby, a diffusion protection layer 31 composed of Si-doped InP with an impurity concentration of $1\times10^{19}$ cm$^{-3}$ or more is formed uniformly with a thickness of several monolayers.

After the diffusion protection layer 31 is formed, under the same conditions, TMIn is continued to be supplied, and a non-doped InP layer 42 is grown on the surface of the diffusion protection layer 31. When the non-doped InP layer 42 is grown, some of the Zn atoms are diffused from the upper cladding layer 23 of the semiconductor mesa part 12 into the diffusion protection layer 31. However, the Zn atoms are trapped by the diffusion protection layer 31 to form Si—Zn pairs, and the diffusion is terminated. The diffusion protection layer 31 finally becomes an InP layer doped with Si and Zn together. Si is an n-type impurity and Zn is a p-type impurity, when these impurity is doped in a III-V compound semiconductor such as InP. In this stage, since the impurities in the diffusion protection layer 31 are compensated for by Si and Zn, the carrier concentration in the diffusion protection layer 31 is very low. The electrical conductivity type of the diffusion protection layer 31 is determined by the impurity of which concentration is higher. Preferably, the electrical conductivity type of the diffusion protection layer 31 is p-type because the resistivity of a p-type InP is higher than that of an n-type InP. The thickness of the diffusion protection layer 31 is preferably in the range of 10 to 80 nm. If the thickness is 100 nm or more, the amount of leakage current flowing through the diffusion protection layer 31 increases, resulting in a degradation of the characteristics of the semiconductor laser device 1, such as an increase in threshold current and a decrease in light emission efficiency.

Figure 6:
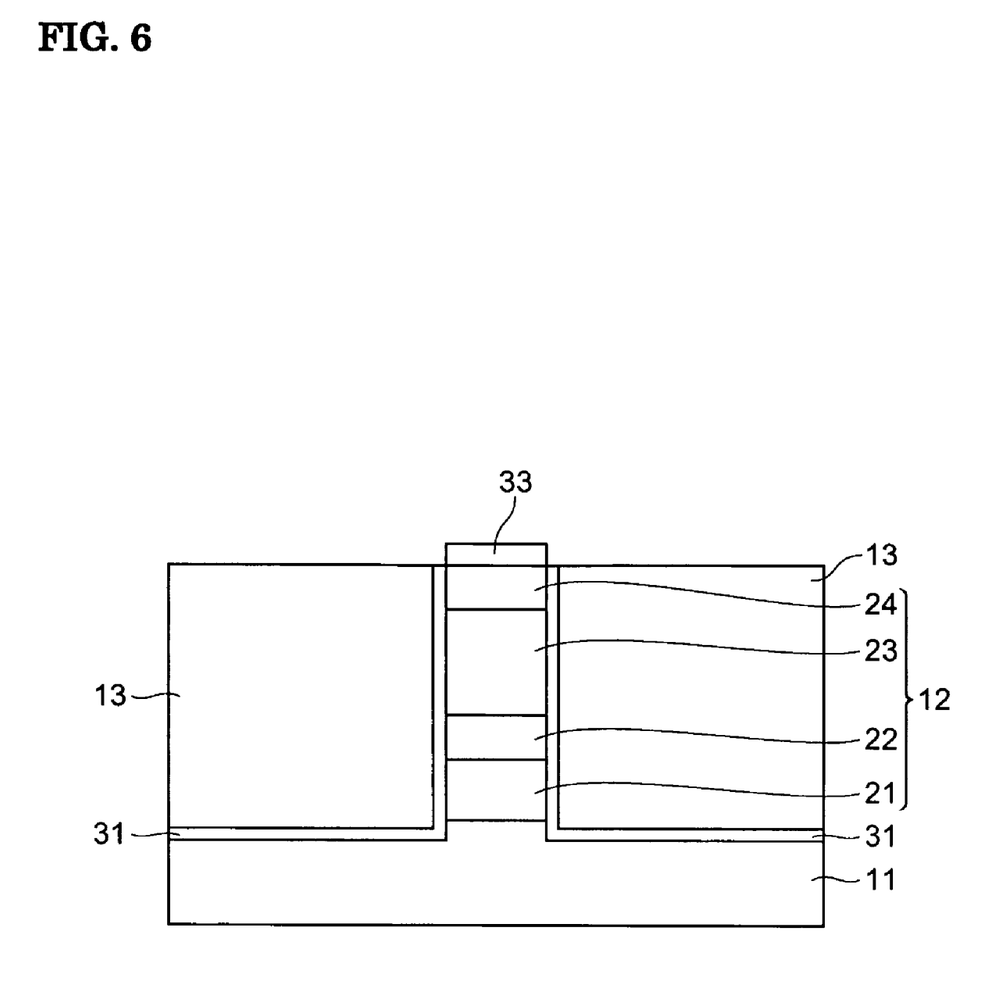
FIG. 6 is a schematic diagram showing a step of forming a buried layer composed of Fe-doped InP, subsequent to the step shown in FIG. 5.

After the non-doped InP layer 42 is grown to a thickness of about 50 nm, ferrocene ($C_{10}H_{10}Fe$) is further supplied into the OMVPE furnace. Ferrocene is one of a source material of an Fe impurity. The flow rate of $C_{10}H_{10}Fe$ is 50 sccm. As shown in FIG. 6, a buried layer 13 composed of Fe-doped InP is grown on the one surface of the semiconductor substrate 11 until the buried layer 13 has a thickness that covers the both sides of the semiconductor mesa part 12.

When the buried layer 13 is grown, Fe diffuses from the Fe-doped InP side toward the non-doped InP layer 42 formed in the initial growth stage, and the non-doped InP layer 42 is integrated into the buried layer 13 composed of Fe-doped InP. Furthermore, some of the Fe atoms in the buried layer 13 are diffused into the diffusion protection layer 31. However, since Si—Zn pairs have already been formed in the diffusion protection layer 31, interdiffusion between Zn and Fe is inhibited.

Figure 7:
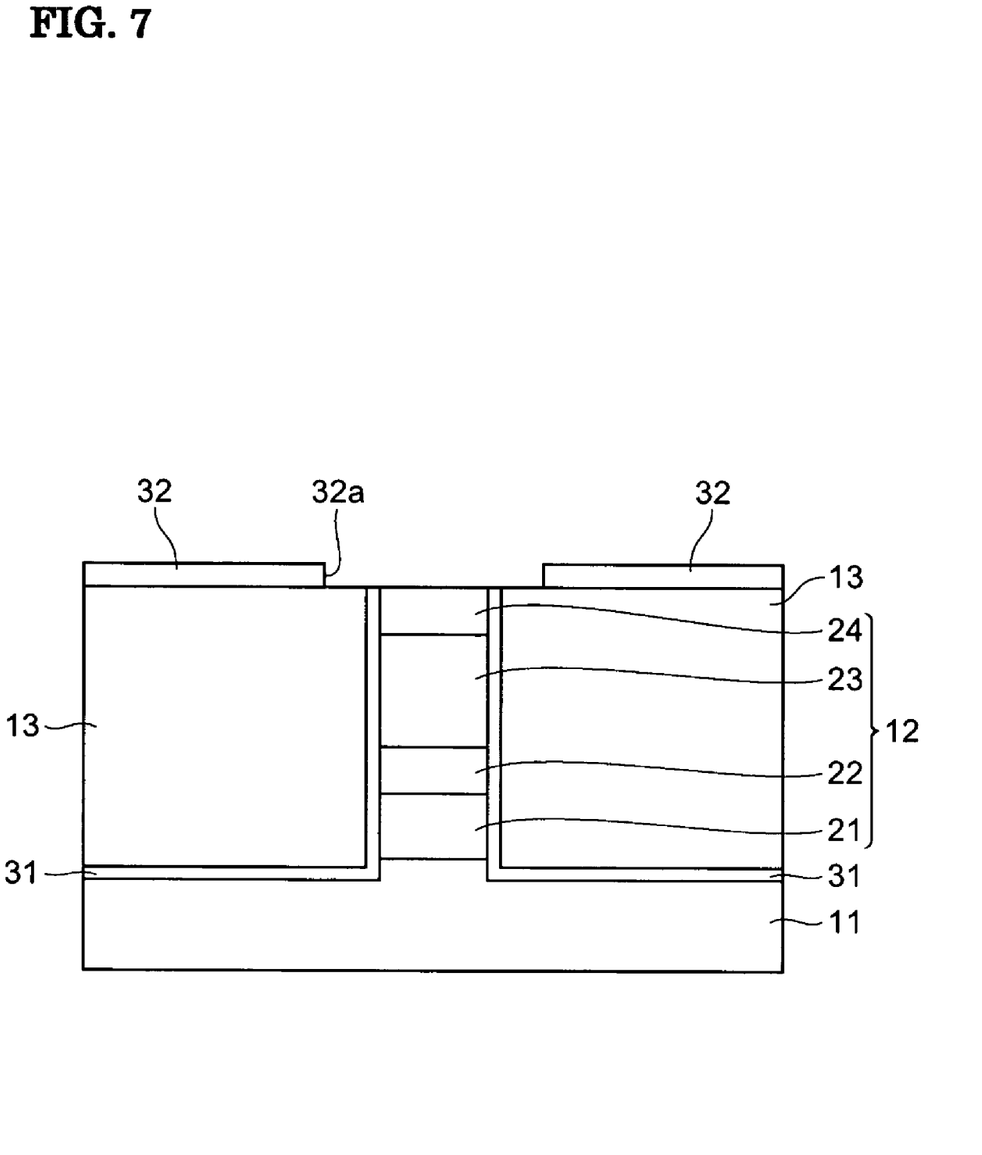
FIG. 7 is a schematic diagram showing a step subsequent to the step shown in FIG. 6.

After the buried layer 13 is formed, the insulating film 33 is removed by predetermined etching. Then, an insulating film 32, for example, composed of $SiO_2$ or SiN, is formed on the surface of the buried layer 13 and the surface of the semiconductor mesa part 12. A predetermined resist layer is formed on the surface of the insulating film 32. A stripe-shaped opening 32a with a width of about 10 μm is formed in the insulating film 32 by photolithography using the resist layer as a mask, and the surface of the semiconductor mesa part 12 is exposed from the insulating mm 32 as shown in FIG. 7.

Then, a stripe-shaped electrode 14 with a stacked metal of Ti/Pt/Au is formed so as to cover the opening 32a. An electrode 14 directly contacts with the contact layer 24 at the window region of opening 32a. Another electrode 15 with a eutectic metal of AuGe/Ni is formed on the other surface of the semiconductor substrate 11. Thereby, a semiconductor laser device 1 shown in FIG. 1 is completed.

As described above, in the method of producing the semiconductor laser device 1, $SiH_4$ is supplied into the OMVPE furnace in the $PH_3$ atmosphere, before the buried layer 13 is grown. As a result, the Si atoms 41 obtained by thermal decomposition of $SiH_4$ are adsorbed on the one surface of the semiconductor substrate 11 and the side surfaces of the semiconductor mesa part 12 in advance. Therefore, when the buried layer 13 is grown subsequently by starting the supply of a source material gas of Group III element, in the initial stage of growth, the InP layer grows while incorporating the Si atoms 41 thereinto. In this stage, the diffusion protection layer 31 composed of Si-doped InP with a high impurity concentration of $1\times10^{19}$ cm$^{-3}$ or more is formed on the one surface of the semiconductor substrate 11 and the side surfaces of the semiconductor mesa part 12.

To supply a group V source material containing phosphorus, a metalorganic raw material gas such as tertiarybutylphosphine (TBP) is also used. Disilane ($Si_2H_6$) and a metalorganic raw material gas such as tetramethylsilane (($CH_3$)$_4$Si) and tetraethylsilane (($C_2H_5$)$_4$Si), or the like are also used to supply Si atoms to be adsorbed on the semiconductor surfaces.

As a result, when the buried layer 13 of InP doped with Fe is grown, Zn diffusing from the upper cladding layer 23 of InP doped with Zn is trapped by the diffusion protection layer 31, and interdiffusion between Zn and Fe at the interface between the upper cladding layer 23 and the buried layer 13 is inhibited. Consequently, in the semiconductor laser device 1, it is possible to prevent a decrease in the carrier concentration of the upper cladding layer 23 and a degradation in the current blocking properties of the buried layer 13 in the vicinity of the interface between the upper cladding layer 23 and the buried layer 13. As a result, it is possible to obtain a semiconductor laser device 1 having excellent reliability.

Furthermore, in the method of producing the semiconductor laser device 1, the diffusion protection layer 31 is formed uniformly at a thickness of several monolayers on the one surface of the semiconductor substrate 11 and the side surfaces of the semiconductor mesa part 12. Consequently, the diffusion protection layer 31 is inhibited from becoming a current leakage path.

Furthermore, according to this embodiment, thermal decomposition of $SiH_4$ is performed at about 650° C. If the temperature is too low, $SiH_4$ is not easily decomposed at the surface of the semiconductor layer, resulting in insufficient adsorption of Si atoms 41. If the temperature is too high, the Si atoms 41 adsorbed on the surface of the semiconductor layer may be desorbed from the surface of the semiconductor layer. Consequently, preferably, thermal decomposition of $SiH_4$ is performed in the range of 600° C. to 700° C. By performing thermal decomposition of $SiH_4$ in the temperature range described above, Si atoms can be suitably adsorbed on the one surface of the semiconductor substrate 11 and the side surfaces of the semiconductor mesa part 12.

Furthermore, Fe doping into the buried layer 13 by supplying $C_{10}H_{10}Fe$ is performed after the non-doped InP layer 42 is grown to a thickness of about 50 nm on the surface of the diffusion protection layer 31. By performing Fe doping into the buried layer 13 after Si—Zn pairs are formed sufficiently in the vicinity of the interface between the diffusion protection layer 31 and the upper cladding layer 23, interdiffusion between Zn and Fe can be more reliably inhibited.

Furthermore, according to this embodiment, unlike the case where a diffusion protection layer composed of Ru-doped InP is used, it is not necessary to separately provide a supply line for a source material of Ru. Consequently, the structure of the production apparatus is not complicated.

From the invention thus described, it will be obvious that the invention may be varied in many ways. Such variations are not to be regarded as a departure from the scope of the invention, and all such modifications as would be obvious to one skilled in the art are intended for inclusion within the scope of the following claims.

What is claimed is:

1. A method of producing a semiconductor optical device comprising:
   a step of growing, on one surface of a semiconductor substrate, a group III-V compound semiconductor layer which includes a cladding layer of a first conductivity type, an active layer, and a Zn-doped cladding layer of a second conductivity type;
   a step of forming a semiconductor mesa part on the semiconductor substrate by etching the group III-V compound semiconductor layer using a predetermined mask;
   a step of supplying a source material containing Si and a group V source material containing phosphorus and thermally decomposing the source material containing Si on the one surface of the semiconductor substrate and side surfaces of the semiconductor mesa part;
   a step of, successively to the step of supplying a source material containing Si and a group V source material containing phosphorus, supplying a group III source material containing indium and the group V source material containing phosphorus after stopping the supply of the source material containing Si a to form a Si-doped InP layer on the one surface of the semiconductor substrate and the side surfaces of the semiconductor mesa part, the Si-doped InP layer being doped the Si atoms adsorbed on the one surface of the semiconductor substrate and side surfaces of the semiconductor mesa part; and
   a step of continuously supplying the group III source material containing indium and a source material containing iron to grow an Fe-doped InP layer which buries the semiconductor mesa part on the one surface of the semiconductor substrate.

2. The method of producing a semiconductor optical device according to claim 1, wherein the group V source material containing phosphorus is a Phosphine or tertiarybutylphosphine.

3. The method of producing a semiconductor optical device according to claim 1, wherein, after a non-doped InP layer is grown at a predetermined thickness on a surface of the Si-doped InP layer, the Fe-doped InP layer is grown while supplying a source material containing iron.

4. The method of producing a semiconductor optical device according to claim 1, wherein the Si-doped InP layer has a thickness in a range of 10 to 80 nm.

5. The method of producing a semiconductor optical device according to claim 1, wherein the Si-doped InP layer has a Si concentration of $4 \times 10^{18}$ cm$^{-3}$ or more.

6. The method of producing a semiconductor optical device according to claim 1, wherein the source material containing Si is a silane-based gas.

7. The method of producing a semiconductor optical device according to claim 6, wherein the silane-based gas is thermally decomposed at a temperature in a range of 600° C. to 700° C.

* * * * *